United States Patent [19]

Ishii et al.

[11] Patent Number: 4,949,669
[45] Date of Patent: Aug. 21, 1990

[54] GAS FLOW SYSTEMS IN CCVD REACTORS

[75] Inventors: Kaoru Ishii; Thomas F. Wilkinson, both of Garland, Tex.

[73] Assignee: Texas Instruments Incorporated, Dallas, Tex.

[21] Appl. No.: 287,174

[22] Filed: Dec. 20, 1988

[51] Int. Cl.$^5$ ............................................. C23C 16/00
[52] U.S. Cl. ................................. 118/719; 118/729; 118/733; 427/248.1; 427/255.5
[58] Field of Search ............... 118/719, 725, 729, 733; 427/255.5, 248.1; 156/345, 646

[56] References Cited

U.S. PATENT DOCUMENTS

| | | | |
|---|---|---|---|
| 3,338,209 | 8/1967 | Bhola | 118/715 |
| 3,441,454 | 4/1969 | Shaikh | 118/725 |
| 3,517,643 | 6/1970 | Goldstein et al. | 118/715 |
| 3,598,082 | 8/1971 | Rice | 118/725 |
| 3,623,712 | 11/1971 | McNeilly et al. | 118/725 |
| 4,047,496 | 9/1977 | McNeilly et al. | 118/725 |
| 4,048,955 | 9/1977 | Anderson | 118/719 |
| 4,081,313 | 3/1978 | McNeilly et al. | 118/725 |
| 4,430,149 | 2/1984 | Berkman | 118/729 |
| 4,792,378 | 12/1988 | Rose et al. | 118/728 |
| 4,820,371 | 4/1989 | Rose | 118/728 |

OTHER PUBLICATIONS

Viva, O. R., "Obtaining Improved Gas Flow in Diffusion Apparatus", IBM Technical Disclosure Bulletin, vol. 14, No. 9 (Feb. 1972), p. 2550.

Primary Examiner—Richard Bueker
Assistant Examiner—Terry J. Owens
Attorney, Agent, or Firm—Gary C Honeycutt; Melvin Sharp; Rhys Merrett

[57] ABSTRACT

Gas flow structures are described for the inputting and exhausting of gases for a continuous vapor deposition reactor to cause an even flow of gases within the reactor chamber and to prevent the deposition of reaction material on the walls of the reactor chamber. Gas inlet and exhaust port structures are provided for multiple-chamber chemical vapor deposition reactors having gas input and exhaust junctions, wherein the ports may include, in order to provide uniform flow, baffles or a plurality of orifices with or without shutters. Two vertically spaced gas inlets may be used, wherein gas from a second inlet prevents deposition on the reactor chamber from gases introduced through the first inlet.

7 Claims, 11 Drawing Sheets

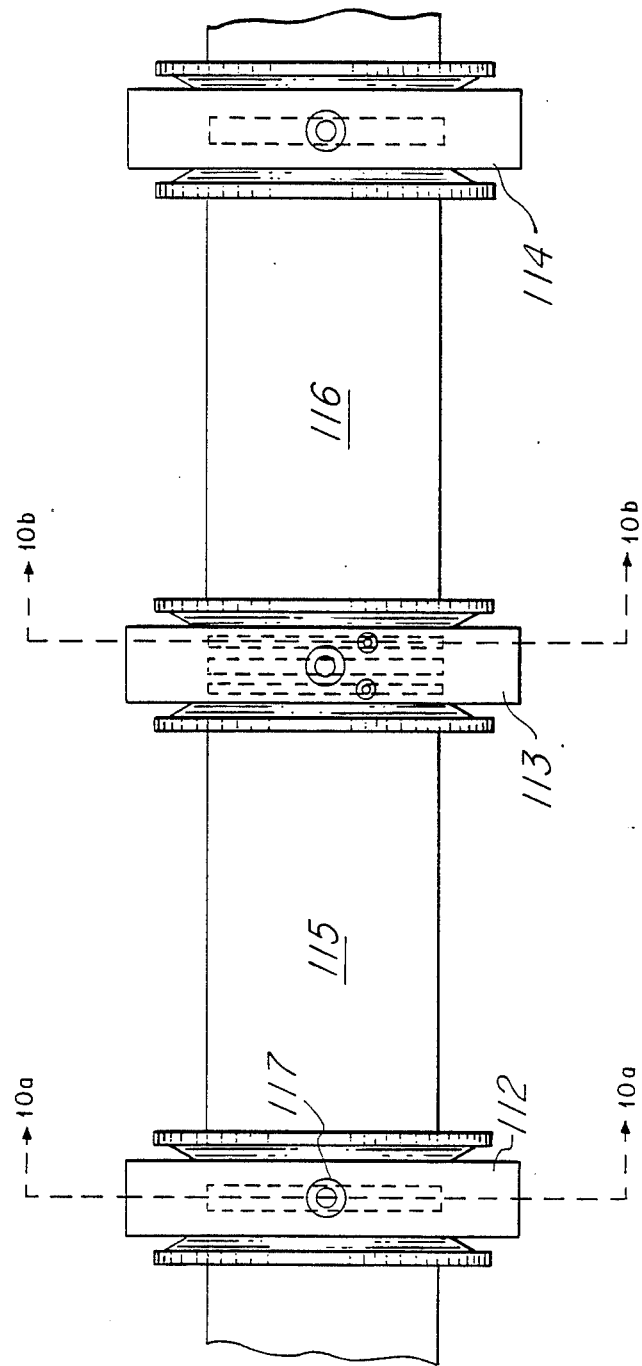

GAS FLOW SYSTEMS IN CCVD REACTORS

FIELD OF THE INVENTION

This invention relates to continuous chemical vapor deposition reactors, and more particularly to improvements in reactor gas distribution for such reactors.

BACKGROUND OF THE INVENTION

A continuous chemical deposition reactor may be a stand-alone process system with a continuous semiconductor wafer flow. Basic subsystems in such a system may include a wafer handling system, a reaction chamber, a gas flow system, a cooling system, and an electrical system.

The wafer handling system may include wafer loaders and unloaders, wafer carriers, and a track for moving a wafer through the reactor chambers.

The reactor chamber subsystem is the site for processing the semiconductor wafer. Each chamber may include a gas supply inlet, a chamber housing, heat lamps and exhaust.

The gas flow subsystem supplies the reactant gases to each chamber, and may include valves, flow controllers and an exhaust system.

The cooling subsystem assists in maintaining the process temperature and reduces the heat radiation to the surrounding components. Both air flow and water flow may be used in the cooling subsystem.

The electrical subsystem provides subsystem control and powers the reactor, and may include power supplies, motors, sensors, valves, and one or more computer/controller.

A basic reactor and process may be as follows. A semiconductor wafer is loaded onto a carrier which enters one end of the reactor through a port and is moved successively through the various chambers and out the other end of the reactor through another port. The reactor may not be physically closed but has gas seals at each end and in between each chamber of the reactor. As an example, a reactor may include eight chambers in which the first chamber consists of a nitrogen seal, the second chamber is a preheat chamber, the next four chambers may be deposition chambers, then a cool-down chamber and the last chamber is a nitrogen seal. A typical gas supply system may supply gases for two different deposition processes which may be directed into any of the deposition chambers.

Each chamber is effectively divided into two portions, a top portion and a bottom portion by the wafer carrier. The junctions between the chambers effectively isolate one chamber from the other by the flow of gases or the exhaust gases from the chambers, and gas flow or seals are used to prevent gases from escaping from the reactor chamber/junction interface.

An example of a prior art continuous chemical vapor deposition reactor may be found in U.S. Pat. No. 4,048,955.

SUMMARY OF THE INVENTION

The invention relates to a multi-chamber continuous chemical vapor deposition reactor and process gas flow and distribution systems used in the reactor for providing better process gas distribution to the reactor chamber and for preventing deposition of deposition material on the reaction chamber. The etch and deposition process in the reactor depends upon gas flow through the reactor. The basic process starts when a semiconductor wafer is removed from a wafer cassette by a robotic arm and is placed in a carrier. The carrier may be one of several configurations to accommodate wafers of different diameters. Each carrier may hold one or more wafers, depending upon the diameter of the wafer.

A semiconductor wafer is placed in a carrier and is moved successively through the various chambers and out the end of the reactor. The semiconductor wafer is placed inverted in the carrier and a lid is placed on top. The lid becomes the susceptor for radiant heat from incandescent lamp heaters.

Each chamber has an associated heat lamp, gas inlets and outlets, a track on which the wafer carrier is moved, and seals to prevent the gas from escaping to the environment out side the reactor, and to prevent exhaust gases from entering the process chambers. The seal may be a mechanical seal or a pressure differential seal to prevent a gas from entering an area within the reactor or escaping the reactor at points other than the exhaust ports.

The gas inlets may be baffled to cause an even distribution of gas with in the reactor, and to prevent unwanted deposition of material on the reactor chamber wall.

Each chamber of the reactor is divided into two regions by the wafer carrier. These two regions are regions above the carrier and below the carrier. The process gas flows through the lower part of the reactor below the carrier and across the exposed semiconductor wafer face.

$H_2$, or an inert gas may be directed through the upper region of the reactor to prevent the process gas from entering the upper region and to help provide the gas pressure differential needed to prevent exhaust gases from entering the process region of the reactor.

The junction between chambers effectively isolates one chamber from the other by the flow of process gases or the exhaust of gas or gases from the chambers. The interfaces between each junction and the reaction chamber on each side require a seal between the interface to prevent gases from escaping into the room in which the reactor is located.

Dividing the gas input and/or providing baffles in the input gas stream smooths out the gas flow in the reactor to provide better deposition on and/or etching of the semiconductor surface. Also, central exhaust ports prevent diagonal gas flow in the reactor which may cause uneven deposition or etch.

Providing a laminar gas flow in the reactor of two different gases, the process gas and $H_2$, or an inert gas, prevents deposition of material on the reaction chamber below the semiconductor wafer.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIG. 10 is a top view of another embodiment of two sections of reaction chambers connected by chamber junctions;

DESCRIPTION OF A PREFERRED EMBODIMENT OF THE INVENTION

Figure 1:
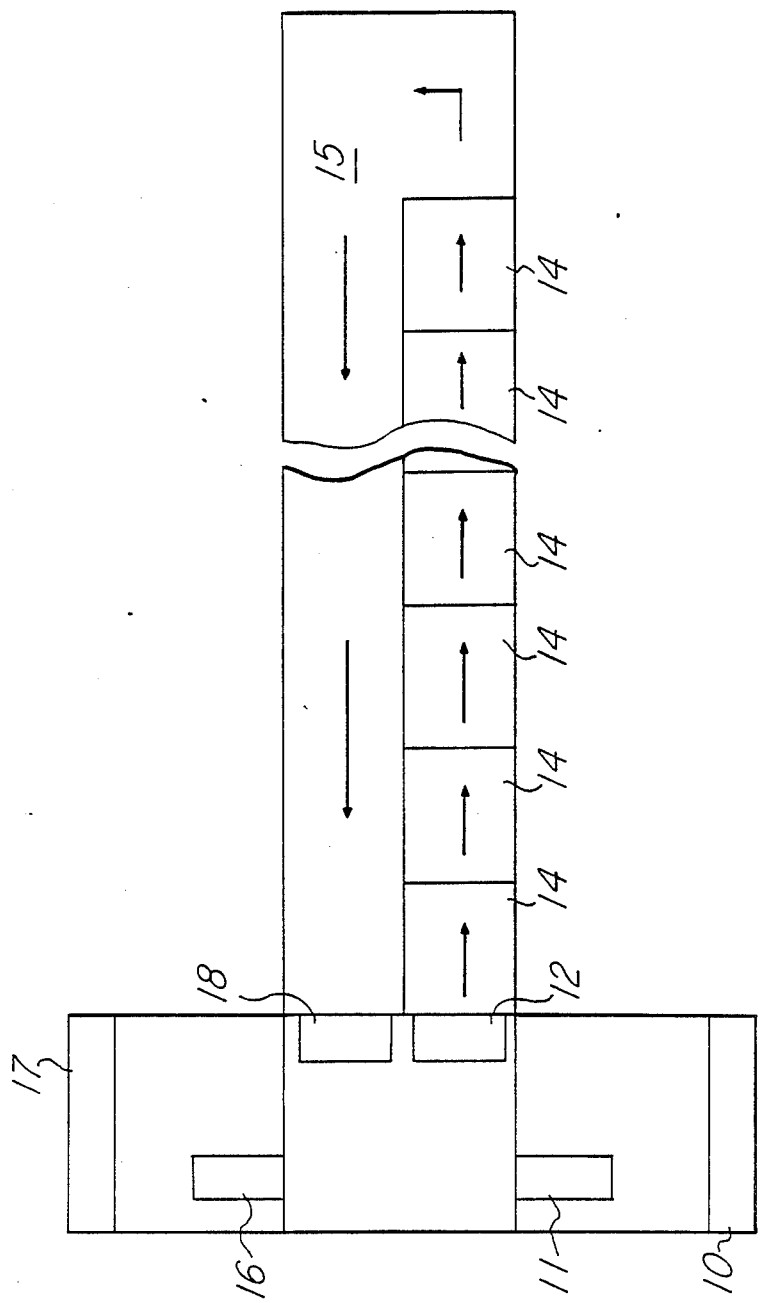
FIG. 1 is a simplified block diagram of the continuous chemical vapor deposition reactor.

FIG. 1 is a block diagram of a reactor of the present invention. Semiconductor wafers that are to be processed are loaded into cassettes 10. A robotic arm 11 removes a wafer from the cassette and places it in a susceptor/carrier which enters the reactor at 12, and then is moved through a plurality of process chambers 14 to the end of the reactor where it enters a return path 15. The semiconductor wafer in the susceptor is moved through return path 15 to an unload station 18. At unload station 18, the wafer is removed from the susceptor by robotic arm 16 and placed in a cassette at 17.

Figure 2:
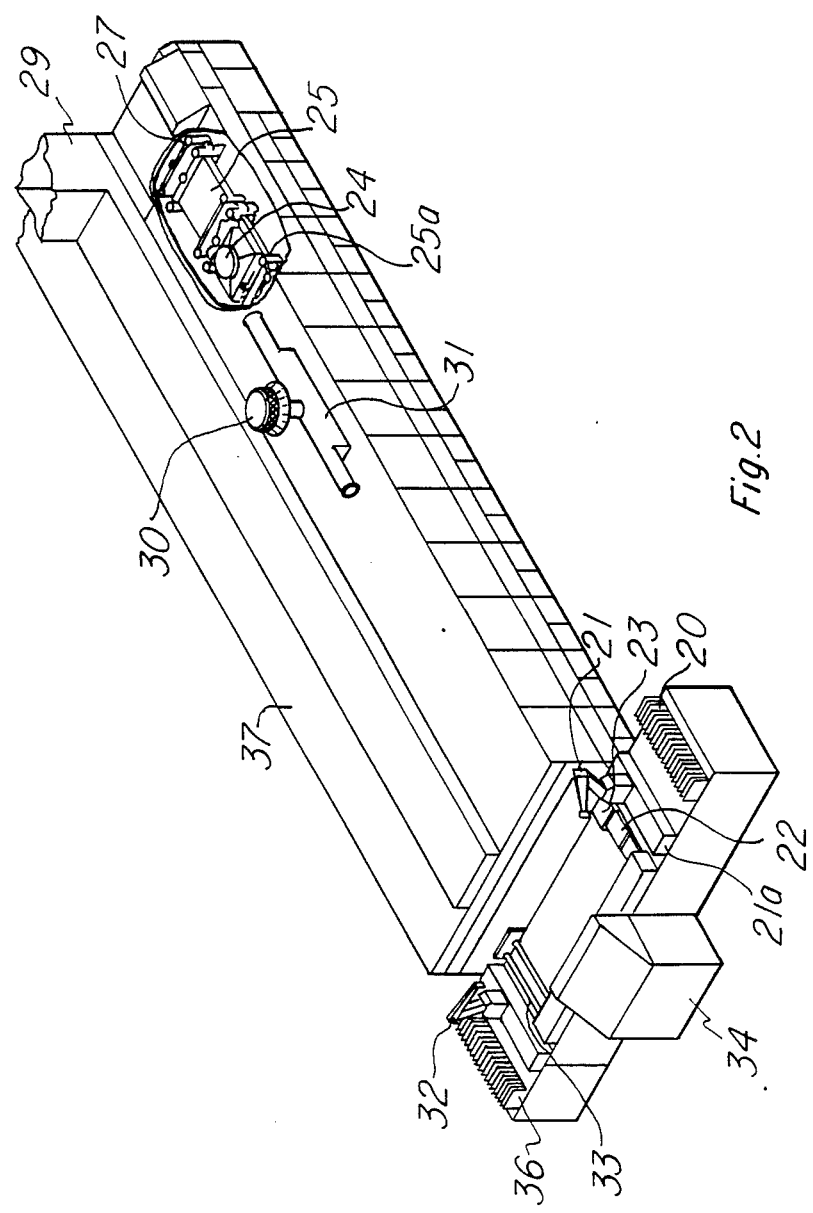
FIG. 2 illustrates a typical CCVD reactor of the present invention.

FIG. 2 is a more detailed illustration of a continuous chemical vapor deposition reactor. A plurality of wafer cassettes 20 are located along and adjacent to a robotic arm 21 which moves along a track 21a. The track allows the robotic arm 21 to move adjacent each of a plurality of wafer cassettes so as to permit the robotic arm to access each wafer in each cassette. The robotic arm lifts a wafer from a cassette and places it in a carrier 22 at the entrance to the reactor. The entrance 23 to the reactor is a seal joint to prevent gases in the reactor from exiting from the reactor.

At the entrance 23, and before the carrier enters the reactor, a vacuum pick-up arm (not illustrated) lifts the lid from the carrier to allow the robotic arm to place a semiconductor wafer into the carrier. After the semiconductor is placed into the carrier the carrier lid is replace and the carrier is indexed through the reactor and the plurality of chambers that make up the reactor.

The carrier is indexed through the reactor and chambers using the length of the carrier and at least one spacer bar between each carrier. As each carrier is indexed into the reactor, each preceding carrier is moved to the next reactor chamber. The indexing is continuous, and as the carrier exits from the last reaction chamber it moves indexed through the return path of the reactor to the exit opening in the reactor, where the lid of the carrier is removed by the return lid pick-up (not illustrated). Tracks 33, which extend through out the reactor, are used to move the wafer carrier through the reactor. A robotic arm 32 mounded on track 32a removes the semiconductor wafer from the carrier and places it in a wafer cassette 36.

The reactor is divided into a plurality of quartz reactor chambers 25. The reaction chambers 25 are joined by a junction 25a through which is introduced the process gases and from which the used gases are exhausted.

Positioned over each reaction chamber is a heater block 24, used to heat the reaction chamber to a desired temperature. Water to cool the lamp housing is introduced through the junctions 25a though inlet 26.

Each junction 25a has at least one exhaust tube 27 for removing exhaust gases from the reaction chambers. The exhaust gases are directed through a burn-off tube 31 to the gas burner 30.

The entire reactor is shrouded in an enclosure 37, and an air duct 29 is provided to circulate and exhaust gas-/air from inside the system shroud.

Figure 3:
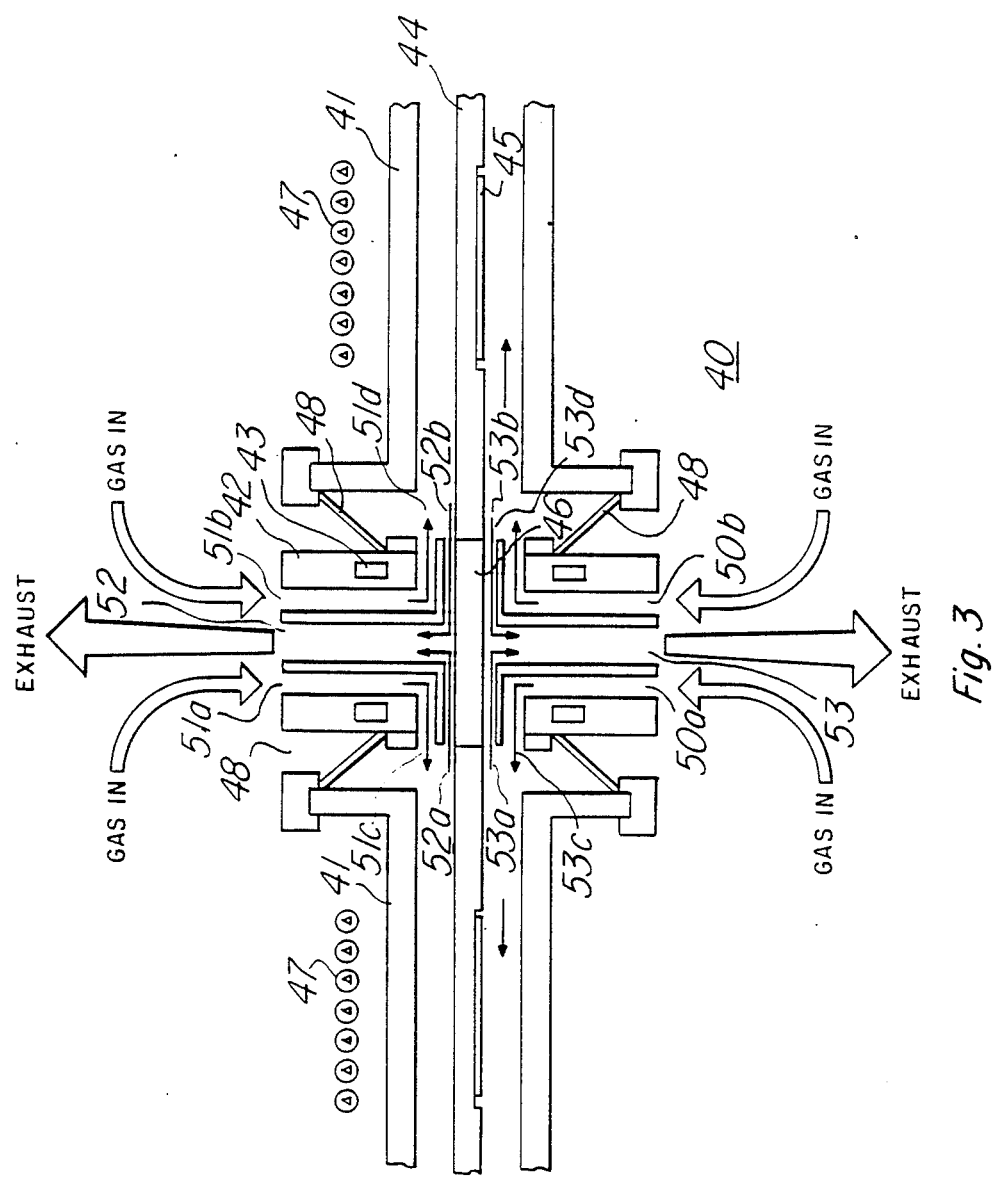
FIG. 3 is a cross sectional view of two reaction chambers joined by a junction.

FIG. 3 illustrates a typical junction 40 between reactor chambers, showing the input and exhaust gas flow, and the path of the susceptor in the chamber.

Each junction is a metal junction and connects consecutive quartz chambers. Each junction may have either air or water cooled walls with the cooling medium flowing through ducts 43 within the walls. Each junction exhausts the gases from the reactor chambers which it connects. Alternate junctions are used to introduce process gases into the reaction chamber.

As illustrated in FIG. 3, gases for the upper portion of the reaction chamber 40 are introduced into the junction through inlets 51a and 51b, and flows into the reaction chambers through openings 51c and 51d.

Process gases are introduced into the lower portion of the reactor chamber 40 through junction gas inlets 50a and 50b, and the gases flow into the chambers through openings 50c and 50d. The junction serves as a manifold for gas inlets and exhaust outlets.

To exhaust gases from the reaction chamber, the junction uses a combination of the positive pressure of the gas, the slight vacuum in the exhaust manifold, and an adjustable damper (not illustrated) in the exhaust manifold. The pressure of the gases in the reaction chamber results in flow of gas out of the chamber into the junction and into the exhaust outlet. Upper exhaust outlet 52 receives exhaust gases through exhaust inlets 52a and 52b. The lower exhaust outlet 53 receives exhaust gases through exhaust inlets 53a and 53b.

The reaction chamber may be connected to the junction by a quartz-to-metal seal, by a metal flange or by high temperature material illustrated at 48 in FIG. 3.

The reaction chamber 41, where the actual reaction occurs, is a generally rectangular quartz chamber. The interior of the quartz chamber is divided into upper and lower sections by the susceptor 44 and spacer 46. The susceptor or wafer carrier slides along two quartz rods or tubes (not illustrated in FIG. 3) during indexing of the carrier through the plurality of reactor chambers and through each junction between reactor chambers.

Quartz is used in the chambers to transmit heat from lamps located on at least one side of the reaction chamber. The lamps are used to heat the semiconductor wafer 45 in carrier 44 to the desired reaction temperature.

The semiconductor wafer carriers or susceptors are made of graphite to withstand the high temperatures of the reaction chambers and to distribute the heat evenly to the wafer being processed.

Figure 4:
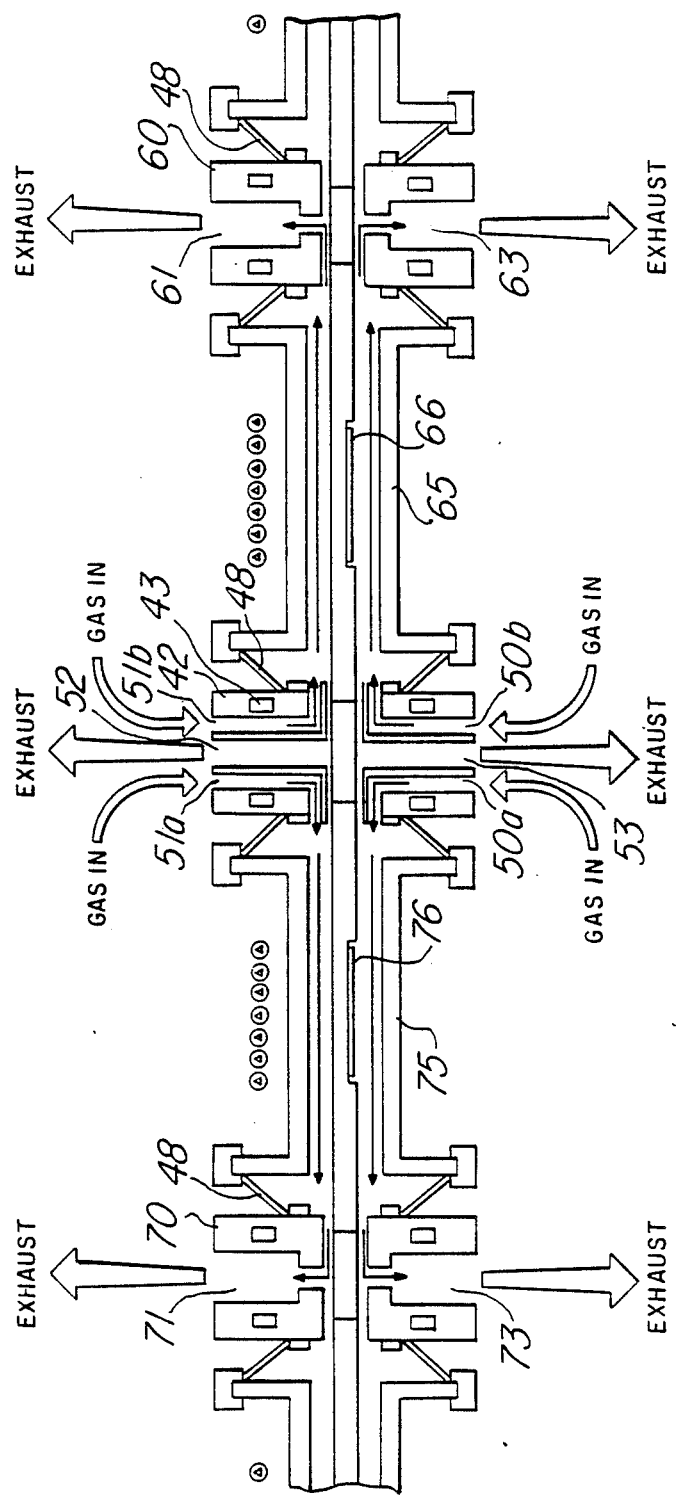
FIG. 4 is a cross sectional view of a two reaction chambers and three junctions illustrating the gas flow between junctions.

FIG. 4 illustrates three junctions and the gas flow from one of the junctions to two other junctions. Junction 42 is the same junction as illustrated in FIG. 3. The other two junctions 60 and 70 are different in the respect that they are only exhaust ports, there are no gas inlets. Process gas is introduced into gas inlets 50a and 50b in junction 42. The gas introduced into inlet 50a flows through the reactor, across the surface of semiconductor wafer 75 and exhausts out exhaust port 73 in junction 70. In a similar manner, process gas introduced into gas inlet 50b of junction 42 flows through reactor 65, across the surface of semiconductor wafer 66, and out exhaust port 63 of junction 60. The gas introduced into junction 42 through inlets 51a and 51b also flows through respective reactors 75 and 65. The gas that flows through reactor 75 exhausts through exhaust port 71 in junction 70, and the gas that flows through reactor 65 exhaust through exhaust port 61 in junction 60. The gas flow through the reactors is shown by arrows through the reactors and to the exhaust ports.

Figure 5:
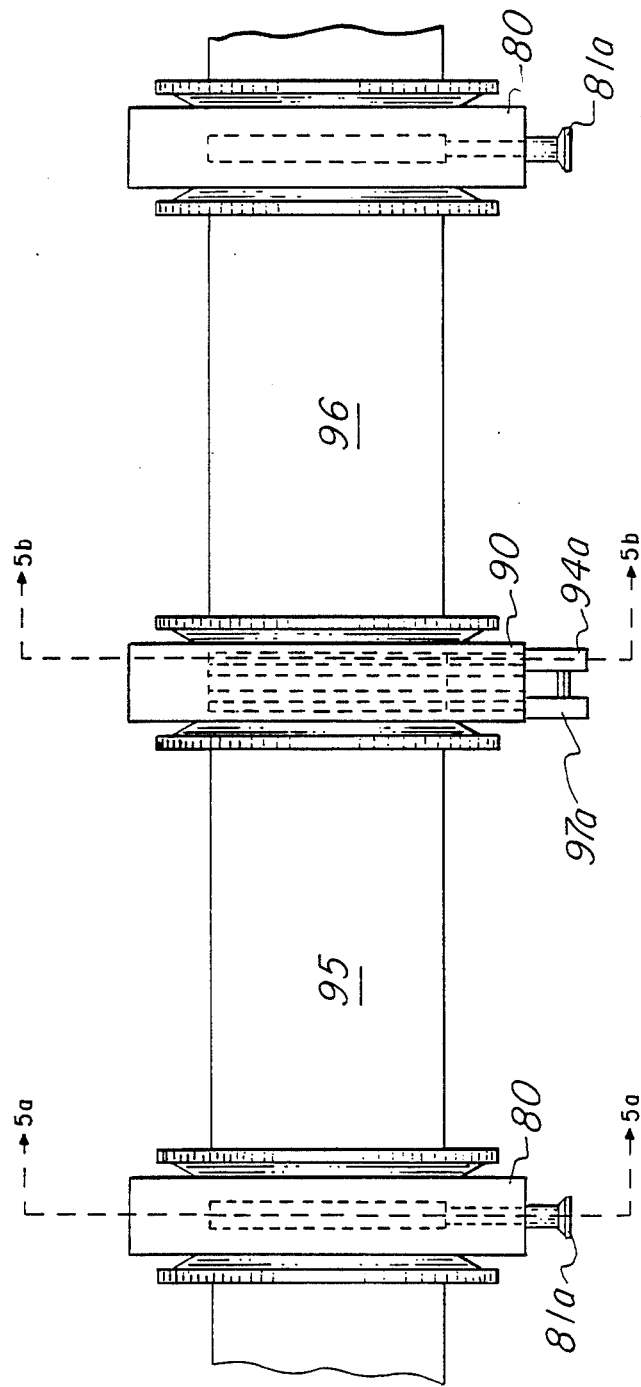
FIG. 5 is the top view of two sections of reaction chambers connected by the chamber junctions.
Figure 5B:
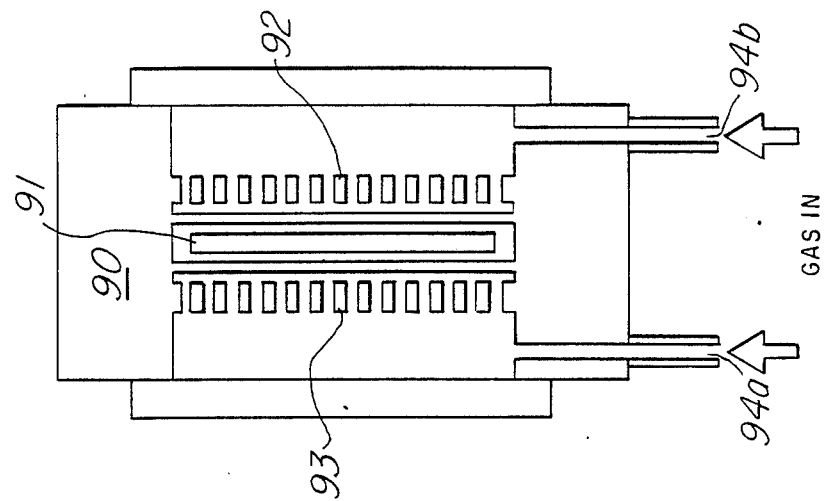
FIG. 5b is a cross-section view of a gas inlet junction.
Figure 5A:
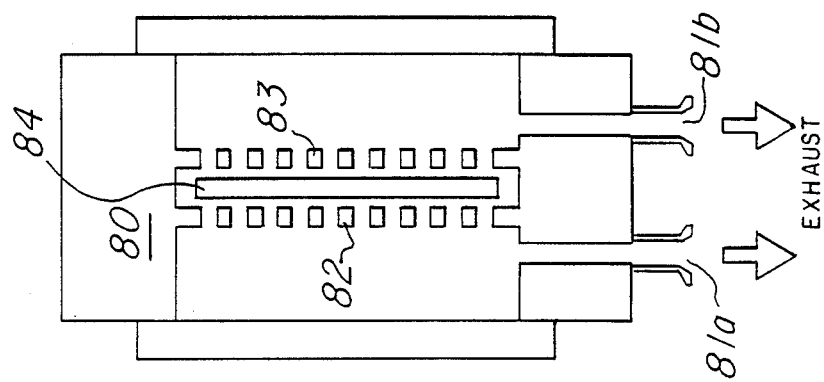
FIG. 5a is a cross-sectional view of an exhaust junction.

FIGS. 5, 5a and 5b illustrate an example of the gas inlet and exhaust ports in the reactor chamber junctions. FIG. 5 is a top view of two exhaust junctions 80, and one inlet/exhaust junction 90. The three junctions connect reaction chambers 95 and 96. Junction 80 is an exhaust junction connected to reaction chamber 95, and has two exhaust ports, 81a and 81b.

Junction 90 has four gas inlets; only the two 94a and 97a are illustrated in the top view FIG. 5. There are four inlets because junction 90 is the gas input junction for both reaction chamber 95 and reaction chamber 96. Gas input in gas inlets 97a, and a gas inlet not shown supply the reaction and process gases to reaction chamber 95; and gas inlets 94a and 94b (FIG. 5b) supply the process gases to reaction chamber 96. The process gases flow through the reaction chambers and exhaust through the exhaust ports 81a and 81b in the exhaust junction 80.

FIG. 5b is a cross-sectional view taken through the gas inlets of gas input junction 90. Junction 90 has two rows of gas inlets 92 and 93 on each side of opening 91. Opening 91 is the opening through which the semiconductor carrier passes as the wafer is moved through the several reactor chambers. The semiconductor carrier (not illustrated) divides the reaction chamber into two parts, an upper part and a lower process part. Inlets 92 introduce process gas below the semiconductor carrier, and are evenly spaced to evenly distribute the gas across the surface of the semiconductor wafer since the semiconductor wafer is carried process surface down in the reaction chamber. Inlet 94a introduces an inert gas into the chamber above the carrier and it at a slightly greater pressure than the process gas introduced through inlet 94b to help contain the process gas in the lower process part of the reaction chamber.

FIG. 5a illustrates the exhaust outlets 82 and 83. Exhaust outlets 83 exhaust the process gas from the lower part of the reaction chamber, and outlets 82 exhaust the inert gas from the upper part of the reaction chamber.

Figure 6:
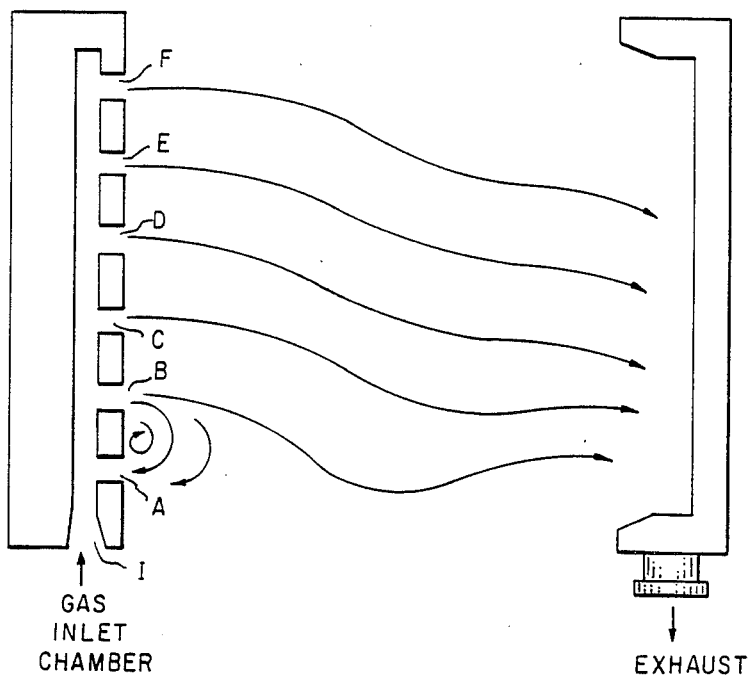
FIG. 6 illustrates gas flow in a reaction chamber using side gas inlets and side exhaust ports.

High velocity input of gas into the reaction chamber sometimes causes an uneven distribution of gas across the reaction chamber. FIG. 6, a gas flow diagram in the lower or process region of the reactor, illustrates a venturi effect of high velocity which causes a recirculation vortex between inlets A and B. Pressure and flow gradually decrease at gas inlet ports C through F as the distance from the gas inlet I increases. Also, the side exhaust port causes a flow of gas diagonally across the chamber.

Figure 7:
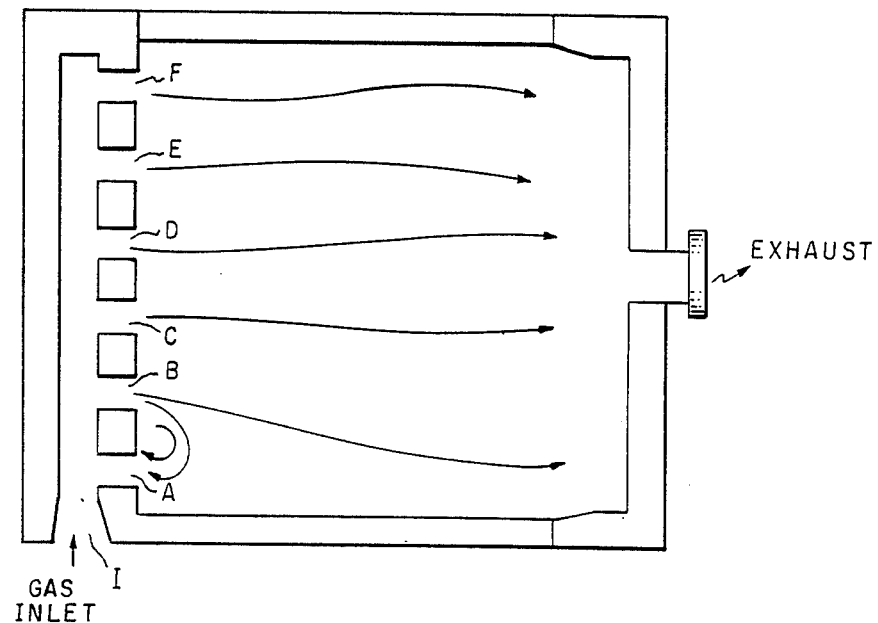
FIG. 7 illustrates gas flow in a reaction chamber using a side gas inlet and a center exhaust port.

FIG. 7 illustrates gas flow in a reaction chamber using the side gas input as in FIG. 6, but with a central exhaust port. The central exhaust port removes the diagonal flow bias, but there is still a recirculation vortex between inlets A and B and a flow gradient from inlet A though F causing most of the process gas to flow through one side, for example inlets A–C.

Figure 8:
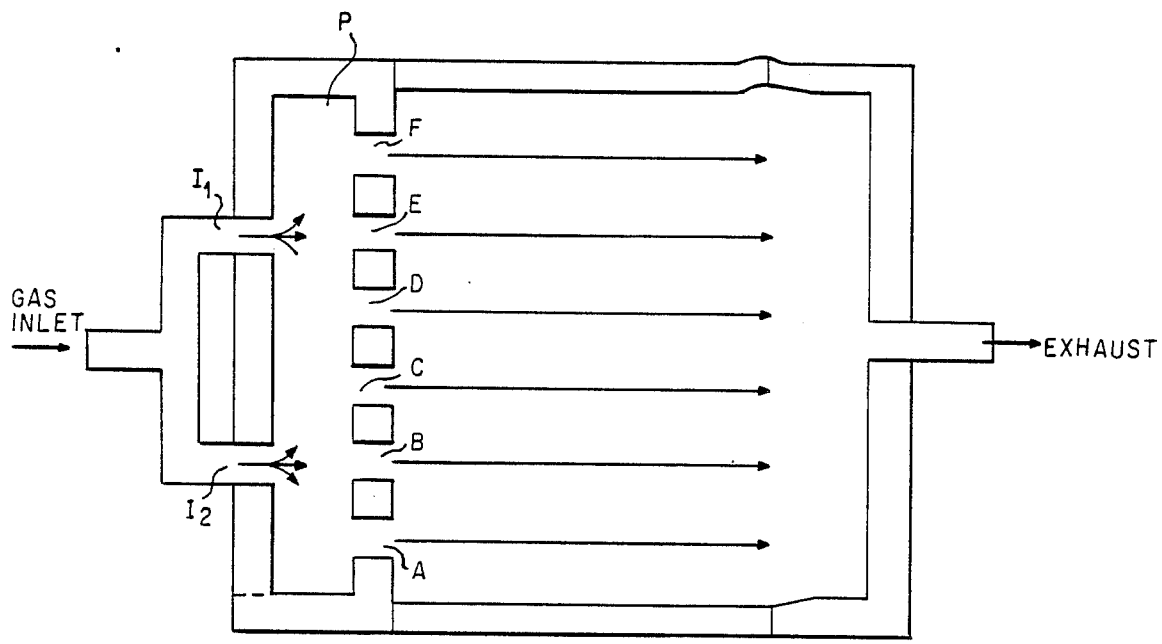
FIG. 8 illustrates gas flow in a reaction chamber using a dual baffled gas inlet and a central exhaust port.

FIG. 8 illustrates gas flow in the reaction chamber when the gas inlet I is divided into two inlets I1 and I2, and a central exhaust is used. The two gas inlets cause the gas to be distributed evenly with in plenum P between the gas inlets A through F into the reaction chamber, and the gas has uniform velocities and an even distribution across the process chamber.

Figure 9:
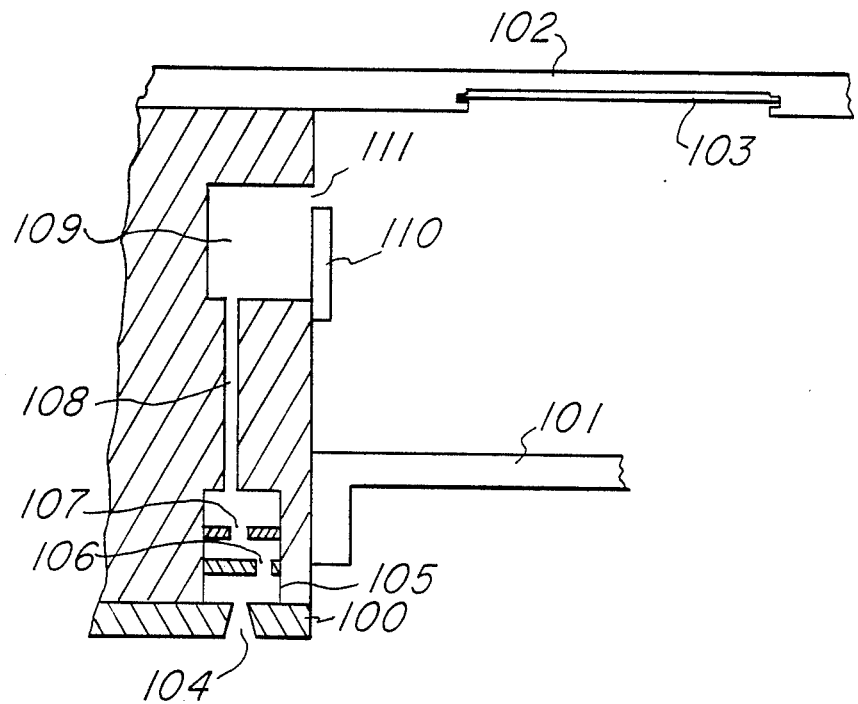
FIG. 9 illustrates a baffled gas inlet with a shuttered outlet into the reaction chamber.

FIG. 9 illustrates a baffle and shutter system for smoothing out the flow through the reaction chamber. Junction 110 is the gas inlet junction for chamber 101 and the reaction part enclosed by carrier 102 carrying semiconductor 103. Gas is introduced into junction 100 at inlet 104. Gas chamber 105 has two baffles 106 and 107 offset from each other so that there is not a straight through path for the gas. The gas exits the gas chamber 105 and enters path 108 to gas outlet chamber or plenum 109. The chamber may be one continuous chamber extending across the junction or may be a series of smaller outlets as illustrated in FIGS. 6–8. The gas outlet 111 into the reaction chamber has a shutter 110 that may be adjusted depending upon the gas pressure/velocity. Shutter 110 is adjusted to provide an even gas flow across the reaction chamber, eliminating vortices and diagonal gas flow.

FIG. 10 is a top view of two exhaust junctions 112 and 114 joining two reaction chambers 115 and 116 and a process gas input junction 113. The gas input junction and the exhaust junction have center input and output ports.

Figure 10B:
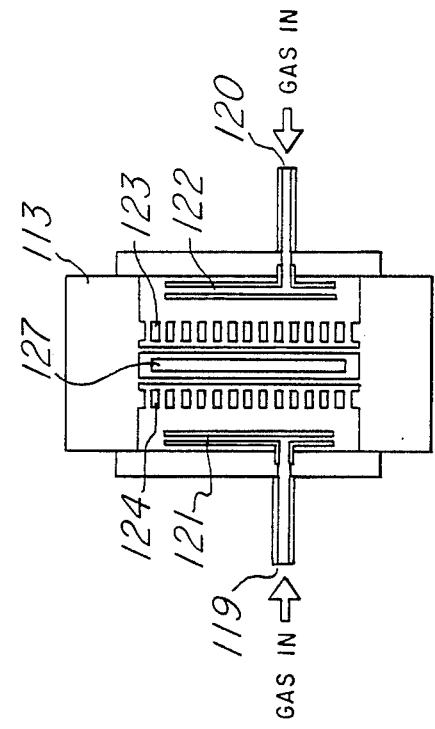
FIG. 10b is a cross-section view of a gas inlet junction with central gas inlets.
Figure 10A:
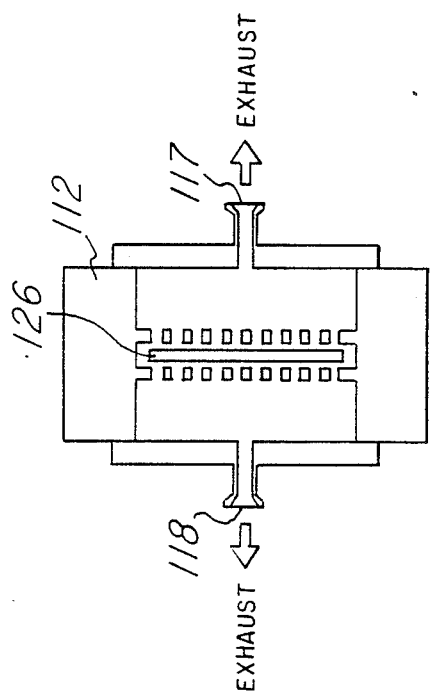
FIG. 10a is a cross-sectional view of an exhaust junction with a central exhaust outlet.

FIG. 10b illustrates the gas input junction 113 which has gas input ports 119 and 120 supplying gas to the reaction part of reaction chambers 115 and 116. Both ports have a baffle 121 and 122 supplying gas to the internal gas outlets 123 and 124. The baffles 121 and 122 perform the function of the baffles in FIGS. 8 and 9, to provide an even distribution through the reaction chamber. This is accomplished by using the baffled input in conjunction with the center exhaust outlets illustrated in FIG. 10a. Exhaust inlets 125 and 126 exhaust through center exhaust outlets 117 and 118, respectively.

Figure 11:
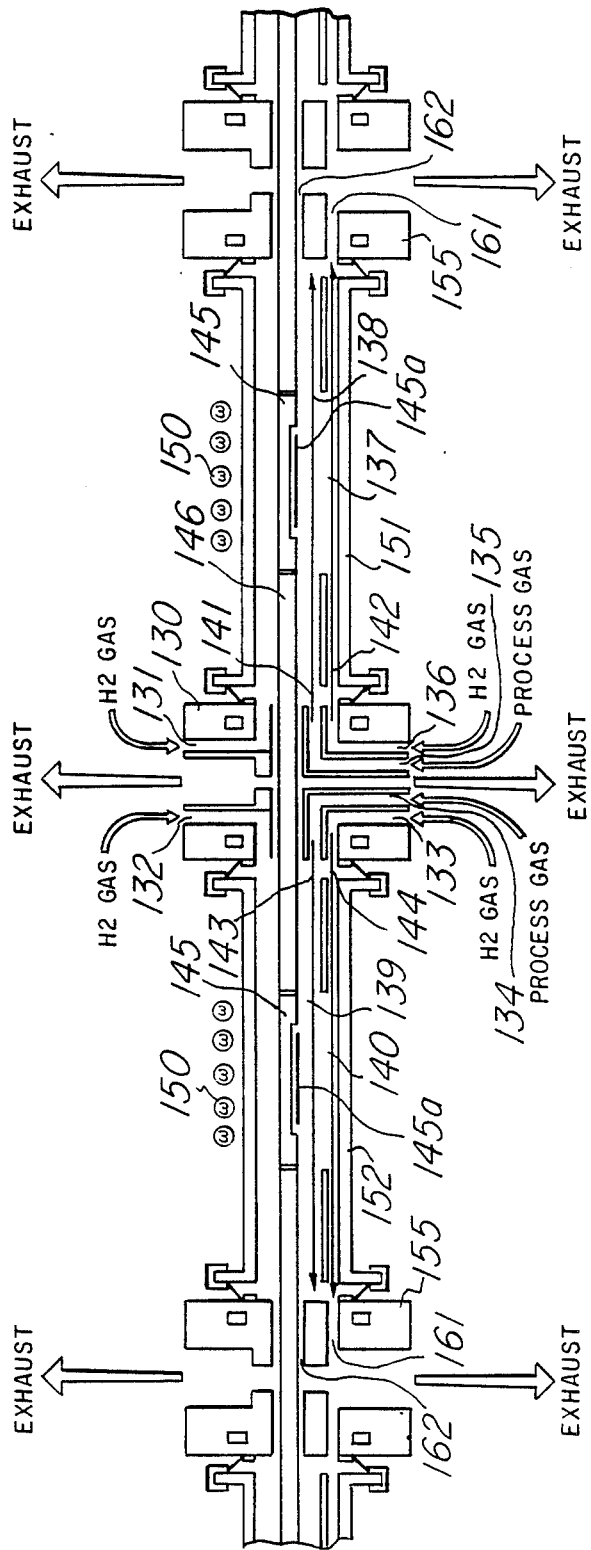
FIG. 11 is a cross sectional view of two reaction chambers connected to chamber junctions illustrating the use of baffles to prevent deposition of deposition products on the reaction chamber below the semiconductor wafer.

When the process gas flows through the lower part of the reaction chamber during a deposition process, it is not uncommon for material to deposit not only on the semiconductor wafer surface, but also on the bottom of the reactor chamber. This is not desirable since the build up may contaminate the deposition chamber or cause excessive deposits of various deposition material. FIG. 11 is a simplified cross-sectional view of a gas input junction, two reaction chambers, and two exhaust junctions, having a gas input structure to prevent deposition of material on the bottom of the deposition chamber.

Gas input junction 130 has two gas inlets 131 and 132 for inputting gas into the top part of the reaction chamber. There are four input gas inlets 133, 134, 135 and 136 for inputting gases into the bottom or process part of the reaction chamber. Process gas is input into reactor 151 through gas inlet 135 and flows though the reactor as indicated by arrow 137. At the same time, H$_2$ or an inert gas is input through inlet 136 and flows through reactor 151 as indicated by arrow 138. The flow of the process gas is parallel to semiconductor 145a in carrier 145 and deposits a desired material on the surface of the semiconductor. At the same time inert gas as indicted by arrow 138 flows parallel to the process gas and the bottom of reactor chamber 151. The laminar flow of the inert gas in between the process gas and the bottom of the reactor chamber prevents material from depositing on the bottom of the reaction chamber.

In a similar manner gases input into inlets 133 and 134 flow parallel as indicated by arrows 139 and 140 preventing a depositing of material on the bottom of the reaction chamber 152.

The laminar gas flow is continued into exhaust junctions 155 on each side of gas inlet junction 130 and the two parallel flowing gases exit through two exhaust ports 161 and 162. The pressure of the inert gas may be slightly higher than that of the process gas to prevent a downward flow of the process gas. The actual gas inlets may be structured as the gas inlets illustrated in FIG. 10b and the exhaust ports may be structured as in FIG. 10a to provide for a evenly distributed gas flow.

What is claimed:

1. Process gas inlet and exhaust port structures for use with continuous chemical vapor deposition reactors having junctions between reaction chambers, where a junction on one end of a reaction chamber is a gas input junction and a junction on the other end of the reaction chamber is an exhaust junction, comprising:
    a gas plenum within the gas input junction having a single input orifice;
    a plurality of orifices for distributing gas into the reaction chamber, said plurality of orifices being located on a side of the plenum opposite said single input orifice and positioned to received equal amounts of gas from said input orifice;
    an exhaust port in an exhaust junction located at the end of the reaction chamber opposite said input junction, said exhaust port being centrally located in respect to the reaction chamber end adjacent said exhaust junction; and
    a shutter partially closing each of said plurality of orifices for distributing gas into the reaction chamber.

2. The process gas inlet and exhaust port structure according to claim 1, wherein the shutter partially closing each of said plurality of orifices is movable to adjust the amount of gas flow through the orifice to reduce gas turbulence and even out the gas flow throughout the reactor chamber.

3. Process gas inlet and exhaust port structures for use with continuous chemical vapor deposition reactors having junctions between reaction chambers, wherein a junction on one end of a reaction chamber is a gas input junction and a junction on the other end of the reaction chamber is an exhaust junction, comprising: at least two gas plenums within the gas input junction, each having a single input orifice, each orifice having a divided output supplying gas to spaced locations in said gas plenum;
    a plurality of orifices in each of the at least two plenums for distributing gas into two reaction chambers, one on each side of the gas input junction, said plurality of orifices in each plenum being spaced from the single input orifice for that plenum and positioned to received equal amounts of gas from said input orifice;
    an exhaust port in an exhaust junction located at the end of the reaction chamber opposite said input junction, said exhaust port being centrally located in respect to the reaction chamber end adjacent said exhaust junction; and
    a shutter partially closing each of said plurality of orifices for distributing gas into the reaction chamber.

4. The process gas inlet and exhaust port structure according to claim 3, wherein the shutter partially closing each of said plurality of orifices is movable to adjust the amount of gas flow through the orifice to reduce gas turbulence and even out the gas flow throughout the reactor chamber.

5. Process gas inlet and exhaust port structures for use with continuous chemical vapor deposition reactors having junctions between reaction chambers, wherein a junction on one end of a reaction chamber is a gas input junction and a junction on the other end of the reaction chamber is an exhaust junction, comprising:
    a first gas inlet from said gas input junction introducing a process gas into the reaction chamber for processing a semiconductor wafer;
    a second gas inlet from said input junction, said second gas inlet being spaced from said first gas inlet to provide a laminar flow of gases from said first and second gas inlets within the reaction chamber;
    wherein said first and second gas inlets are vertically displaced from each other such that when gas is introduced into said second gas inlet the gas from the second inlet prevents deposition on the reaction chamber from said first gas.

6. Process gas inlet and exhaust port structures for use with continuous chemical vapor deposition reactors having junctions between reaction chambers, wherein a junction on one end of a reaction chamber is a gas input junction and a junction on the other end of the reaction chamber is an exhaust junction, comprising:
    a first gas inlet from said gas input junction introducing a process gas into the reaction chamber for processing a semiconductor wafer;
    a second gas inlet from said input junction, said second gas inlet being spaced from said first gas inlet to provide a laminar flow of gases from said first and second gas inlets within the reaction chamber;
    wherein a semiconductor wafer is moved through a central region of the reaction chamber face down and the process gas is introduced beneath the wafer for processing the wafer face, and the second gas is introduced below the process gas to prevent deposition of material carried in the processes gas on the reaction chamber wall.

7. A method of introducing and exhausting process gases into continuous chemical vapor deposition reactors having junctions between reaction chambers to provide an even distribution of gas flow, wherein a junction on one end of a reaction chamber is a gas input junction and a junction on the other end of the reaction chamber is an exhaust junction, comprising the steps of:
    introducing gas into a gas plenum in the gas input junction such that the gas flows evenly into the reaction chamber;
    exhausting the process gas through a central exhaust port in an exhaust junction; and
    introducing the process gas and another gas, said another gas introduced into the reaction chamber to flow laminar to the process gas to prevent the deposition of material onto the reaction chamber wall.

* * * * *